(12) United States Patent
Caesar et al.

(10) Patent No.: US 9,863,829 B2
(45) Date of Patent: Jan. 9, 2018

(54) SENSOR

(71) Applicants: Carl Freudenberg KG, Weinheim (DE); EDC Electronic Design Chemnitz GmbH, Chemnitz (DE)

(72) Inventors: Thomas Caesar, Weinheim (DE); Renate Tapper, Bensheim (DE); Steffen Heinz, Burgstaedt (DE); Marco Neubert, Chemnitz (DE)

(73) Assignees: CARL FREUDENBERG KG, Weinheim (DE); EDC ELECTRONIC DESIGN CHEMNITZ GMBH, Chemnitz (DE)

( * ) Notice: Subject to any disclaimer, the term of this patent is extended or adjusted under 35 U.S.C. 154(b) by 0 days.

(21) Appl. No.: 15/500,542

(22) PCT Filed: Jul. 23, 2015

(86) PCT No.: PCT/EP2015/066855
§ 371 (c)(1),
(2) Date: Jan. 31, 2017

(87) PCT Pub. No.: WO2016/016078
PCT Pub. Date: Feb. 4, 2016

(65) Prior Publication Data
US 2017/0219448 A1 Aug. 3, 2017

(30) Foreign Application Priority Data
Aug. 1, 2014 (DE) .......................... 10 2014 011 247

(51) Int. Cl.
*H01L 23/00* (2006.01)
*G01L 9/00* (2006.01)
*B81B 7/00* (2006.01)

(52) U.S. Cl.
CPC ............ *G01L 9/0042* (2013.01); *B81B 7/008* (2013.01); *H01L 24/16* (2013.01); *H01L 24/45* (2013.01); *B81B 2201/0264* (2013.01); *B81B 2203/0127* (2013.01); *B81B 2207/012* (2013.01); *H01L 2224/48137* (2013.01)

(58) Field of Classification Search
CPC ... H01L 24/16; H01L 24/45; H01L 24/48137; B81B 2201/0264; B81B 2203/0127; B81B 2207/012; B81B 7/008; G01L 9/0042
See application file for complete search history.

(56) References Cited

U.S. PATENT DOCUMENTS 5,663,596 A * 9/1997 Little .................... H01L 23/485
257/692
6,078,102 A * 6/2000 Crane, Jr. ............. H01L 23/053
257/693

(Continued)

FOREIGN PATENT DOCUMENTS

| DE | 102009040707 A1 | 4/2011 |
| DE | 102010044616 A1 | 3/2012 |
| DE | 202013102632 U1 | 12/2013 |

*Primary Examiner* — Earl Taylor
(74) *Attorney, Agent, or Firm* — Leydig, Voigt & Mayer, Ltd.

(57) ABSTRACT

A sensor has an electronic chip and a sensor chip which are arranged within a functional volume which is at the most 4-5 mm long, a maximum 2-3 mm wide, and the maximum height is 0.5-0.8 mm, thereby potentially providing a compact sensor.

15 Claims, 6 Drawing Sheets

(56) References Cited

U.S. PATENT DOCUMENTS

| | | | | |
|---|---|---|---|---|
| 7,104,129 | B2* | 9/2006 | Nasiri | B81C 1/0023 73/504.04 |
| 7,790,492 | B1* | 9/2010 | Baumhauer, Jr. | B81C 1/0023 257/E23.133 |
| 9,673,170 | B2* | 6/2017 | Fischer | H01L 24/97 |
| 2004/0119150 | A1* | 6/2004 | Hwang | H01L 23/5386 257/686 |
| 2006/0130582 | A1* | 6/2006 | Kurogi | B81C 1/0023 73/514.16 |
| 2007/0290364 | A1* | 12/2007 | Gupta | B81C 1/0023 257/777 |
| 2009/0052008 | A1* | 2/2009 | Mcnie | G02B 5/281 359/290 |
| 2009/0127638 | A1* | 5/2009 | Kilger | B81B 7/007 257/415 |
| 2010/0065961 | A1* | 3/2010 | Elian | H01L 21/565 257/698 |
| 2010/0193923 | A1* | 8/2010 | Tanaka | B81B 7/007 257/676 |
| 2012/0235308 | A1* | 9/2012 | Takahashi | H01L 21/50 257/777 |
| 2014/0048946 | A1* | 2/2014 | Bowles | H01L 23/3121 257/774 |
| 2014/0054798 | A1* | 2/2014 | Bowles | H01L 23/49811 257/777 |
| 2014/0210019 | A1* | 7/2014 | Nasiri | B81C 1/0023 257/415 |
| 2014/0336485 | A1* | 11/2014 | Mujeeb-U-Rahman | A61B 5/1473 600/345 |
| 2014/0374855 | A1* | 12/2014 | Lo | B81B 7/0058 257/417 |
| 2015/0298966 | A1* | 10/2015 | Bowles | B81B 7/02 257/417 |
| 2016/0043054 | A1* | 2/2016 | Fischer | H01L 21/6835 438/107 |
| 2016/0071818 | A1* | 3/2016 | Wang | H01L 25/0655 257/774 |
| 2016/0079216 | A1* | 3/2016 | Hosomi | H01L 21/6835 257/738 |
| 2016/0146849 | A1* | 5/2016 | Yaguchi | G01C 19/5783 73/514.35 |

* cited by examiner

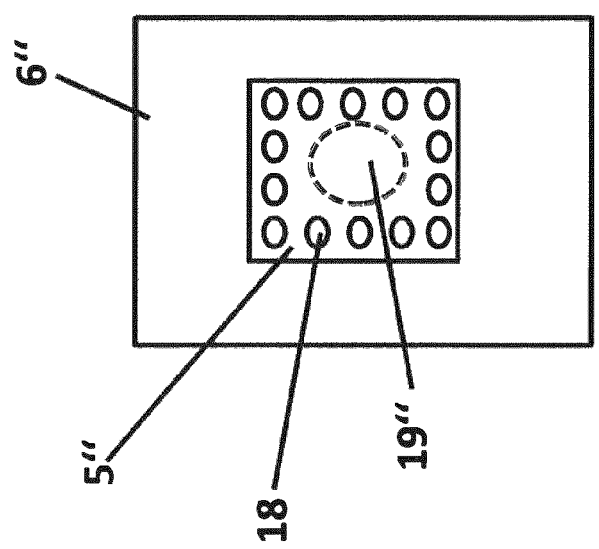

SENSOR

CROSS-REFERENCE TO RELATED APPLICATIONS

This application is a U.S. national stage application under 35 U.S.C. §371 of International Application No. PCT/EP2015/066855, filed on Jul. 23, 2015, and claims benefit to German Patent Application No. DE 10 2014 011 247.0, filed on Aug. 1, 2014. The International Application was published in German on Feb. 4, 2016, as WO 2016/016078 A1 under PCT Article 21(2).

FIELD

The invention relates to a sensor.

BACKGROUND

DE 10 2010 044 616 A1 discloses a micro system for a filter insert.

A filter element in which a filter medium is associated with a sensor is already known from DE 10 2009 040 707 A1.

Known filter elements are disadvantageous in that the sensors are often designed to be relatively large so as to record and analyze one or more physical variables. It is relatively expensive to manufacture filter elements of this kind. Furthermore, larger sensors are difficult to install on filter elements.

In particular, in the prior art, it is only possible to record very small pressure differentials in the range of 10-500 Pa using relatively large sensors, and this requires a large amount of installation space.

Furthermore, it is quite difficult and cost-intensive to attach a relatively large sensor of this kind to a filter element. Moreover, a sensor of this kind is often contacted by means of cords. This is particularly undesirable because handling cords is cumbersome and is not accepted by end users.

SUMMARY

An aspect of the invention provides a sensor, comprising: an electronic chip; and a sensor chip, wherein the electronic chip and the sensor chip are arranged within a functional volume which is at most 5 mm in length, at most 3 mm in width, and at most 0.8 mm in height.

BRIEF DESCRIPTION OF THE DRAWINGS

The present invention will be described in even greater detail below based on the exemplary figures. The invention is not limited to the exemplary embodiments. All features described and/or illustrated herein can be used alone or combined in different combinations in embodiments of the invention. The features and advantages of various embodiments of the present invention will become apparent by reading the following detailed description with reference to the attached drawings which illustrate the following:

FIG. 6 is a schematic transparent view from above of a sensor chip which is arranged on a printed circuit board, a plurality of contacting bumps being arranged so as to surround a diaphragm.

DETAILED DESCRIPTION

Figure 1:
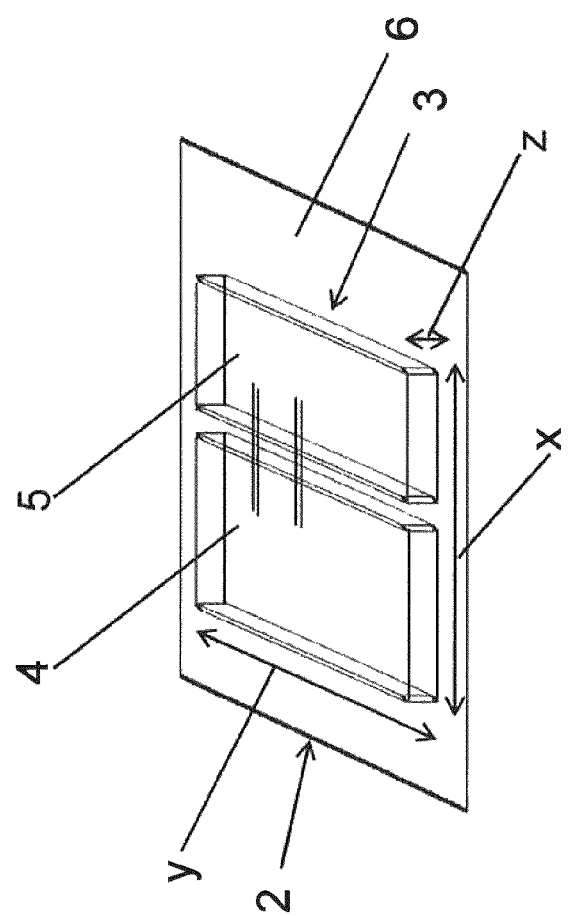
FIG. 1 is a schematic view of the sensor, the sensor comprising just two chips, namely one electronic chip and one sensor chip, which are interconnected and define a functional volume.

An aspect of the invention is therefore to provide a compact sensor.

According to an aspect of the invention, the first consideration was that there is a need to miniaturize a sensor in order to record the smallest pressure differentials in the range of 10-500 Pa.

In this regard, it was recognized that miniaturization and a preferably cordless, non-pluggable power supply make it possible to integrate the sensor in a cost-effective manner. Integrating the sensor and transferring power and data in a preferably cordless and non-pluggable manner also does not require any additional installation effort.

In concrete terms, according to an aspect of the invention, it was recognized that a sensor having a very small functional volume is particularly easy to install. Furthermore, material can be saved if a very small functional volume is selected.

An aspect mentioned at the outset is therefore achieved.

180 nm technology can be utilized in order to arrange an electronic system and a diaphragm on a sensor chip. This allows the sensor chip and thus the functional volume to be compact.

A plurality of electronic chips and/or a plurality of sensor chips could be arranged within the functional volume. This would make it possible to record a plurality of physical variables.

The electronic chip could comprise a plurality of analog and/or digital interfaces, by means of which various sensor chips could be analyzed. This would mean that a single electronic chip could be combined with various sensors or sensor chips.

Power and/or data could be transmitted cordlessly by means of the electronic chip and/or the sensor chip via a radio interface, in particular a RFID interface, or via a non-pluggable connection of contacts. This would mean that complex cabling is no longer required.

The sensor chip comprising a converter element and/or the sensor chip comprising a converter element and a sensor front end could be manufactured, in its entirety, by means of 180 nm CMOS technology, in particular in order to record a pressure differential in the range of 10-500 Pa at a resolution of 5 Pa. This would make it possible to measure pressures in a precise and efficient manner.

In this context, the converter element could be designed as a transistor or resistor on a silicon diaphragm. This would result in a very reliable arrangement.

The electronic chip and the sensor chip could be arranged one next to the other on a printed circuit board. This would result in a very flat structure.

The electronic chip and the sensor chip could be interconnected in an electrically conductive manner by means of bonding wires. In this way, the electronic chip and the sensor chip can be positioned very close together. The use of bonding wires provides for simple manufacturing because the bonding wires are fixed to the sides of the chips that face away from the printed circuit board.

The electronic chip and the sensor chip could be interconnected in an electrically conductive manner by means of a flip-chip connection using contacting bumps. This type of contact is useful when electrical devices, in particular oxide layers, arranged on a silicon substrate face a printed circuit board and the pure silicon side of the silicon substrate faces away from the printed circuit board.

The sensor chip could comprise a diaphragm and electronic devices. The sensor chip can consist of a silicon substrate and/or be arranged in the electronic system. In this way, the sensor chip can be very compact. It is even conceivable for the diaphragm to consist only of a silicon substrate and at least one or more converter elements. A converter element is preferably a doped region.

In light of this, the sensor chip could comprise a silicon substrate into which a diaphragm that does not have any electronic devices and/or oxide layers except for converter elements is etched. The converter elements are preferably designed as n-doped or p-doped regions and/or are formed in the diaphragm. Etching the diaphragm also gives the sensor chip a compact design because a material which is intrinsically present in the silicon substrate is used as the diaphragm. The diaphragm is therefore designed as a silicon diaphragm.

Electronic systems or oxide layers having a thickness of approximately 10 μm could be etched away until the silicon substrate is reached, the silicon substrate being etched into to a depth of 500 μm on the other side in order to form the diaphragm.

The electronic chip and the sensor chip could be arranged on a printed circuit board, in which a passage is formed, the passage constituting the only fluid-conductive access to a volume which is formed or sealingly delimited by the printed circuit board, the sensor chip and a sealing collar which surrounds the sensor chip, a first diaphragm surface of a diaphragm facing the volume. A second diaphragm surface, opposite the first diaphragm surface, faces the atmosphere or another space separated from the volume in a fluid-tight manner. As a result, the sensor chip can measure pressure differentials when different pressures are acting on the two diaphragm surfaces.

Figure 4:
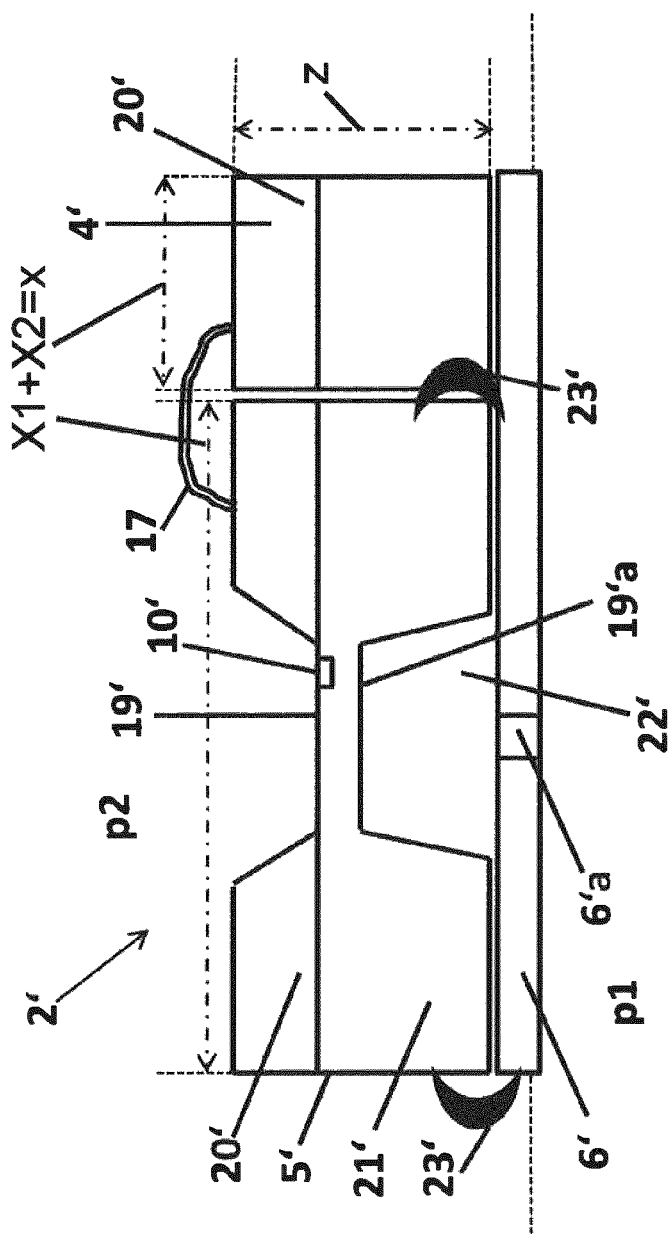
FIG. 4 is a schematic view of the sensor chip and the electronic chip which are interconnected by means of bonding wires, oxide layers or other electronic devices on a silicon substrate of the sensor chip facing away from the printed circuit board.

The functional volume, within the meaning of this document, is formed only by the sum of the extensions of the electronic chips and sensor chips in the x, y, and z directions in each case. The bonding wires, the contacting bumps and/or parts of a sealing collar are not part of the functional volume and do not increase said volume. In particular, the bonding wires, the contacting bumps and parts of the sealing collar can protrude beyond the functional volume. A part of the sealing collar that is arranged between an electronic chip and sensor chip is still not to be included in the total extension of the functional volume in the x, y or z direction. Essentially, only the measurements of the electronic chips and sensor chips as such are taken into account in each of the directions. FIG. 4 shows an example of how to calculate or measure the extensions x and z.

In this context, the sensor chip could have a resolution of 5 Pa. The sensor chip could have a resolution in the range of 1 Pa to less than 5 Pa. The sensor chip could have a resolution in the range of greater than 5 Pa to 10 Pa.

In order to analyze the sensor data, the sensor has to be connected to a device electronic system. This connection is usually established by means of a cord.

FIG. 1 shows that the sensor 2 comprises at least one electronic chip 4 and at least one sensor chip 5 which are arranged within a functional volume 3 which is at most 4 to 5 mm in length, at most 2 to 3 mm in width and at most 0.5 to 0.8 mm in height.

The distance x is 5 mm, the distance y is 3 mm and the distance z is 0.8 mm.

The electronic chip 4 comprises a plurality of analog and/or digital interfaces, by means of which various sensor chips can be analyzed.

Power and/or data is/are transmitted cordlessly by means of the electronic chip 4 and the sensor chip 5. This can be achieved via a radio interface or a non-pluggable connection of contacts.

The electronic chip 4 and the sensor chip 5 are arranged on a printed circuit board 6, which has a larger area than the functional volume 3.

The sensor chip 5 has a resolution of 5 Pa.

Figure 2:
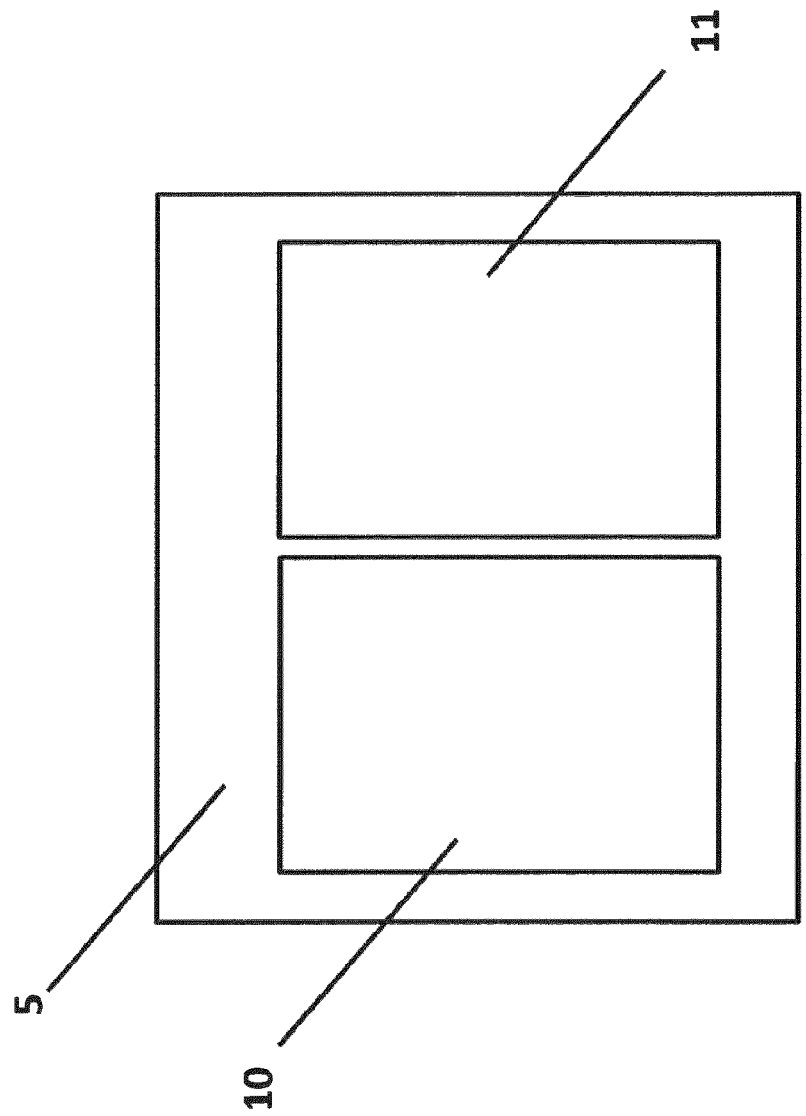
FIG. 2 is a schematic view of the sensor chip.

FIG. 2 is a schematic view of the sensor chip 5. The sensor chip 5 makes it possible to detect a pressure differential in the range of 10-500 Pa. The sensor chip 5 can consist of either just one converter element 10, which converts a change in pressure into an electric signal, or a converter element 10 and a sensor front end 11.

The sensor chip 5 comprising a converter element 10 and/or the sensor chip 5 comprising a converter element 10 and a sensor front end 11 is manufactured, in its entirety, by means of 180 nm CMOS technology.

The sensor front end 11 could comprise an electronic system or be designed as such.

The converter element 10 could be designed as a transistor or as a resistor on a silicon diaphragm.

Figure 3:
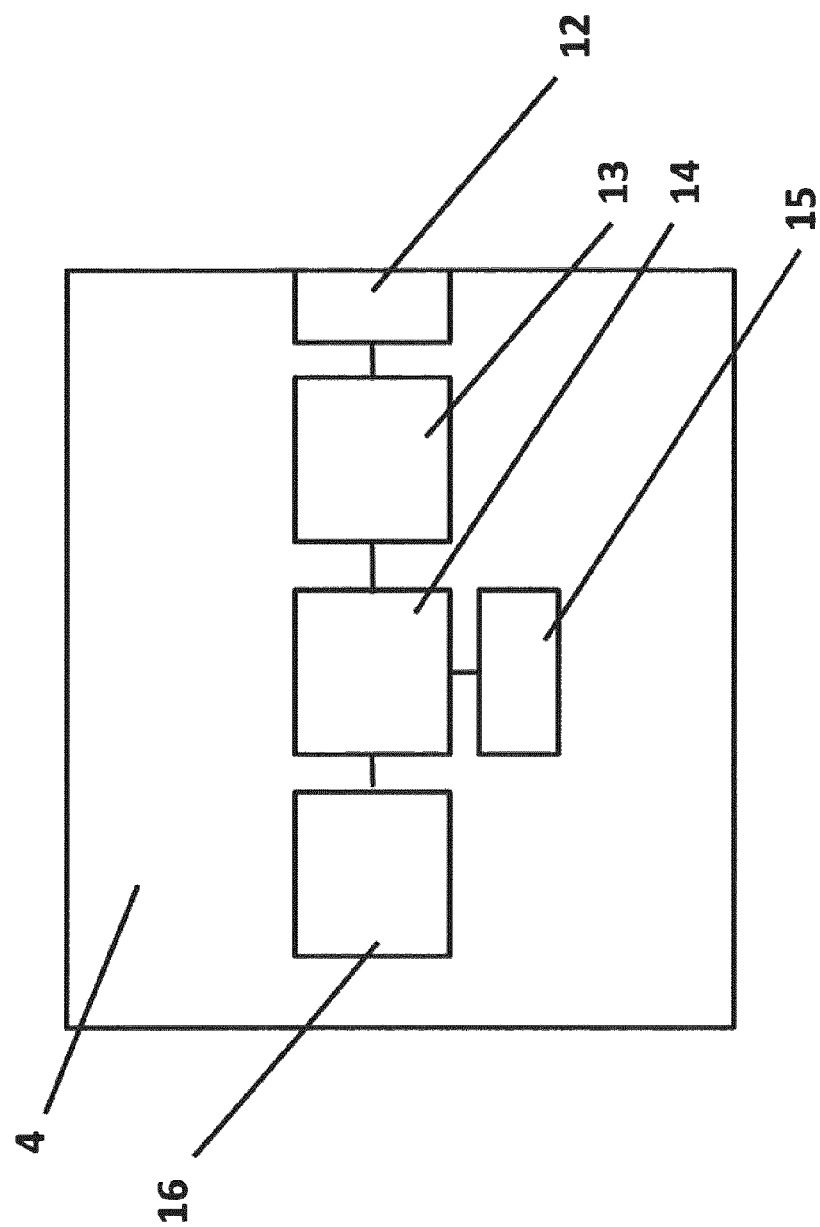
FIG. 3 is a schematic view of the electronic chip.

FIG. 3 is a schematic view of the electronic chip 4. The electronic chip 4 comprises analog and/or digital interfaces for connection to additional sensors 12 or to additional sensor chips. The electronic chip 4 comprises a sensor front end 13. The electronic chip 4 comprises a microcontroller 14 for signal processing. The electronic chip 4 comprises a memory 15. The electronic chip 4 comprises an RFID front end 16 for a contactless power supply and/or for a power supply by means of a contact connection.

FIG. 4 shows, by means of an additional sensor 2', that the electronic chip 4' and the sensor chip 5' are arranged one next to the other on a printed circuit board 6'. The electronic chip 4' and the sensor chip 5' are interconnected in an electrically conductive manner by means of bonding wires 17.

Figure 5:
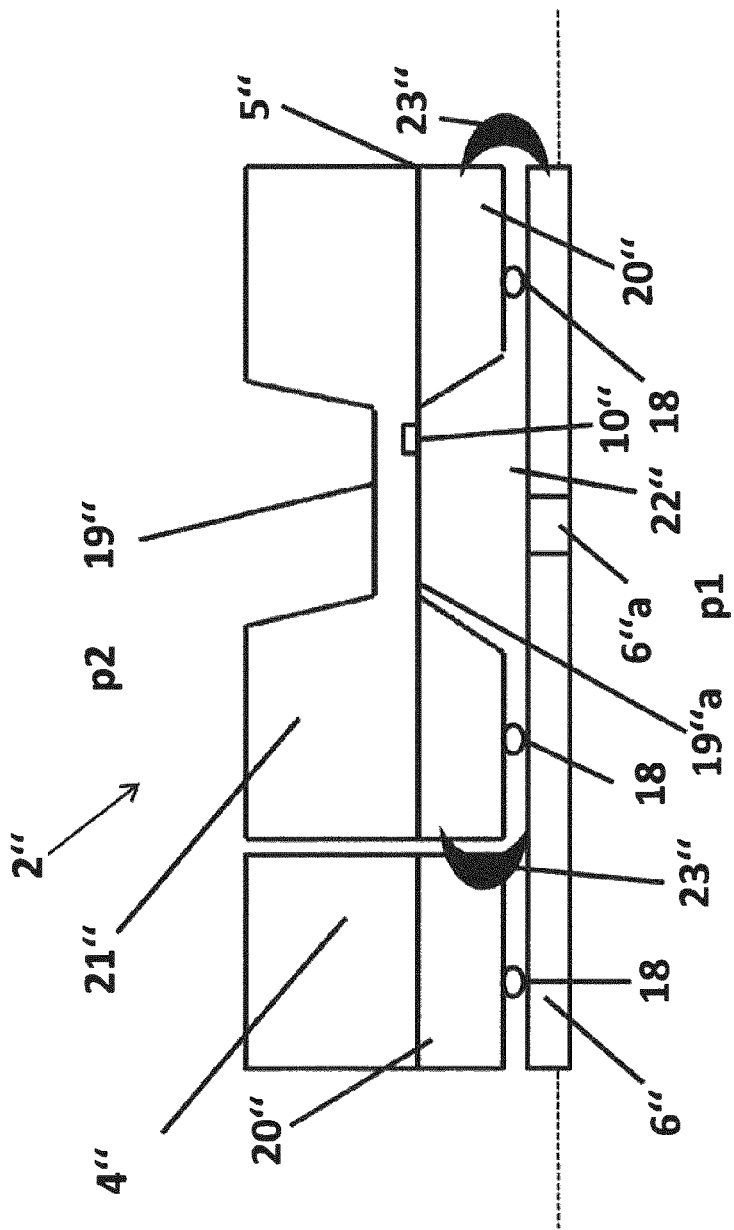
FIG. 5 is a schematic view of the sensor chip and the electronic chip which are connected to the printed circuit board and to one another in an electrically conductive manner by means of contacting bumps, oxide layers or other electronic devices on a silicon substrate of the sensor chip facing the printed circuit board.

FIG. 5 shows, by means of an additional sensor 2", that the electronic chip 4" and the sensor chip 5" are interconnected in an electrically conductive manner by means of a flip-clip connection using contacting bumps 18.

In FIG. 4 and FIG. 5, the sensor chip 5', 5" comprises a diaphragm 19', 19" and electronic devices 20', 20" that may comprise oxide layers. The sensor chip 5', 5" comprises a silicon substrate 21', 21" in each case, into which a diaphragm 19', 19" that does not have any electronic devices and/or oxide layers except for converter elements 10', 10" is etched.

The electronic chip 4', 4" and the sensor chip 5', 5" are arranged on a printed circuit board 6', 6", in which a passage 6'a, 6"a is formed, the passage 6'a, 6"a constituting the only fluid-conductive access to a volume 22', 22" which is formed by the printed circuit board 6', 6", the sensor chip 5', 5" and a sealing collar 23', 23" which surrounds the sensor chip 5', 5", a first diaphragm surface 19'a, 19"a of the diaphragm 19', 19" facing the volume 22', 22".

The electronic chip 4', 4" is bonded. The electronic chip 4', 4" also comprises electronic devices 20', 20". The volume 22', 22" is only sealed by the printed circuit board 6', 6", the sensor chip 5', 5" and the sealing collar 23', 23" which surrounds the sensor chip 5', 5".

There are different pressures p1 and p2 on two different sides of the diaphragm 19', 19", respectively. The sensor 2', 2" can be used to measure the pressure differential between the sides when the two sides are tightly separated from one another and the sensor 2', 2" is suitably arranged and mounted in a sealed manner. This is indicated schematically by the dashed line.

The sealing collar 23', 23" preferably consists of a casting compound that can sealingly flow even into small gaps.

FIG. 6 is a transparent view which shows that the contacting bumps 18 surround a diaphragm 19". The contacting bumps 18 have to be attached in a precise manner such that the sensor chip 5" and the diaphragm 19" are subject to the same amount of mechanical stress.

An interface between the sensor chip 5, 5', 5" and the electronic chip 4, 4', 4" can be located in the functional volume 3.

While the invention has been illustrated and described in detail in the drawings and foregoing description, such illustration and description are to be considered illustrative or exemplary and not restrictive. It will be understood that changes and modifications may be made by those of ordinary skill within the scope of the following claims. In particular, the present invention covers further embodiments with any combination of features from different embodiments described above and below. Additionally, statements made herein characterizing the invention refer to an embodiment of the invention and not necessarily all embodiments.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B, and C" should be interpreted as one or more of a group of elements consisting of A, B, and C, and should not be interpreted as requiring at least one of each of the listed elements A, B, and C, regardless of whether A, B, and C are related as categories or otherwise. Moreover, the recitation of "A, B, and/or C" or "at least one of A, B, or C" should be interpreted as including any singular entity from the listed elements, e.g., A, any subset from the listed elements, e.g., A and B, or the entire list of elements A, B, and C.

The invention claimed is:

1. A sensor, comprising:
   an electronic chip;
   a sensor chip; and
   a printed circuit board,
   wherein the electronic chip and the sensor chip are arranged within a functional volume which has a length in a range of from 4 to 5 mm, a width in a range of from 2 to 3 mm, and a height in a range of from 0.5 to 0.8 mm, and
   wherein the electronic chip and the sensor chip are each directly mounted on the printed circuit board and arranged so as to be next to one another on the printed circuit board.

2. The sensor of claim 1, comprising:
   a plurality of the electronic chip and/or a plurality of the sensor chip, arranged within the functional volume.

3. The sensor of claim 1, wherein the electronic chip includes a plurality of analog and/or digital interfaces configured to analyze various sensor chips.

4. The sensor of claim 1, configured to cordlessly transmit power and/or data using the electronic chip and/or the sensor chip via a radio interface or via a non-pluggable connection of contacts.

5. The sensor of claim 1, wherein the sensor chip includes a converter element and/or a converter element and a sensor front end.

6. The sensor of claim 5, wherein the converter element is configured as a transistor or resistor on a silicon diaphragm.

7. The sensor of claim 1, configured such that a pressure differential in a range of 10-500 Pa can be measured using the sensor chip.

8. The sensor of claim 7, wherein the sensor chip has a resolution of 5 Pa.

9. The sensor of claim 7, wherein the sensor chip has a resolution in a range of from 1 Pa to less than 5 Pa.

10. The sensor of claim 7, wherein the sensor chip has a resolution in a range of from greater than 5 Pa to 10 Pa.

11. The sensor of claim 1, wherein the electronic chip and the sensor chip are interconnected in an electrically conductive manner by bonding wires.

12. The sensor of claim 1, wherein the electronic chip and the sensor chip are interconnected in an electrically conductive manner by a flip-chip connection using contacting bumps.

13. The sensor of claim 1, wherein the sensor chip includes a diaphragm and an electronic device.

14. The sensor of claim 1, wherein the sensor chip includes a silicon substrate into which a diaphragm that does not have any electronic devices and/or oxide layers except for converter elements is etched.

15. The sensor of claim 1, wherein a passage is formed in the printed circuit board,
   wherein the passage constitutes the only fluid-conductive access to a volume formed by the printed circuit board, the sensor chip, and a sealing collar which surrounds the sensor chip, and
   wherein a first diaphragm surface of a diaphragm faces the volume.

* * * * *